(12) United States Patent
Houston

(10) Patent No.: US 6,791,864 B2
(45) Date of Patent: Sep. 14, 2004

(54) COLUMN VOLTAGE CONTROL FOR WRITE

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/337,055

(22) Filed: Jan. 6, 2003

(65) Prior Publication Data

US 2004/0130930 A1 Jul. 8, 2004

(51) Int. Cl.[7] .............................................. G11C 11/00
(52) U.S. Cl. ...................... 365/154; 365/156; 365/206
(58) Field of Search ................................ 365/154, 156, 365/206

(56) References Cited

U.S. PATENT DOCUMENTS 6,147,898 A * 11/2000 Yamada ...................... 365/156

2003/0214833 A1 * 11/2003 Hsu et al. .................... 365/154

* cited by examiner

Primary Examiner—Huan Hoang
(74) Attorney, Agent, or Firm—Rose Alyssa Keagy; W. James Brady, III; Frederick J. Telecky, Jr.

(57) ABSTRACT

A memory device including array (12) of memory cells (10) having an array voltage Vdd bussed such that the Vdd of columns are controlled independently. During a WRITE cycle, the Vdd of the addressed columns is lowered. Thereafter, the stability of the cell is reduced, and the cell (10) is advantageously more easily written. Cells in other columns in the addressed row remain at full Vdd and are more stable. Cells in un-addressed rows in the addressed columns will not have the access transistors turned on, and therefore will be more stable. With WRITE being facilitated with a lowered column Vdd, the cell is designed to be more stable than would otherwise have been possible while maintaining the ability to WRITE.

15 Claims, 1 Drawing Sheet

COLUMN VOLTAGE CONTROL FOR WRITE

FIELD OF THE INVENTION

The present invention is generally related to memory integrated circuits, and more particularly to SRAM cells and noise margin problems during write.

BACKGROUND OF THE INVENTION

In a memory cell array, generally one row of cells and a subset of the columns are addressed in a WRITE cycle. With scaling (L, Vdd and Vt), it is increasingly difficult to design SRAM cells that have enough stability i.e. noise margin (SNM) (resistance to upset) but still can be written into. Generally, design variations that improve stability degrade the ability to WRITE (Vtrip).

Referring to FIG. 1 there is shown at 10 a conventional SRAM memory cell 10 seen to have a wordline (WL), supply voltages Vdd and Vss, and bit-lines B and B_. Conventionally, during a READ cycle, the wordline WL is high, both bit-lines B and B_are precharged high, and the access transistor pulls against the driver. Either a strong pass or a weak load leads to destabilization of the cell 10 during a READ cycle.

For a WRITE cycle, the wordline WL is high, bit-line B is high and bit-line B_is low, or vise-versa. Here, the access transistor pulls against the load, whereby a strong pass and weak load enables the WRITE.

SUMMARY OF THE INVENTION

The present invention achieves technical advantages as a memory device including a memory cell array having an array Vdd bussed such that the Vdd of columns are controlled independently. In a WRITE cycle, the Vdd of the addressed columns is lowered. Thereafter, the access transistor is turned on more strongly with the wordline WL at array Vdd than is the load transistor at the reduced column Vdd, and the cell is advantageously more easily written. Cells in other columns in the addressed row remain at array Vdd and are more stable. Cells in un-addressed rows in the addressed columns will not have the access transistors turned on, and therefore will be more stable. With WRITE being facilitated with a lowered column Vdd, the cell is designed to be more stable than would otherwise have been possible while maintaining the ability to WRITE.

The present invention relieves the trade-off of stability and ability to WRITE to a memory cell. There is provided the enhanced ability to WRITE with fairly simple circuitry while achieving a more stable cell. The cells operate over a wider range of supply voltage and temperature, and/or a wider range of process parameters.

DETAILED DESCRIPTION OF THE PREFERRED EMBODIMENT

Figure 1A:
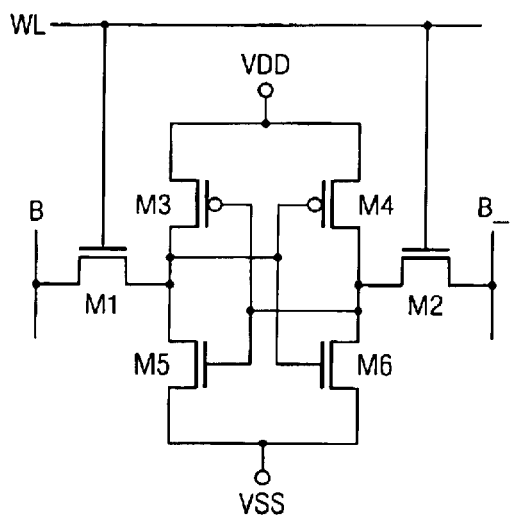
FIG. 1A is a schematic of a conventional SRAM memory cell 10 and associated column Vdd being the array Vdd.
Figure 1B:
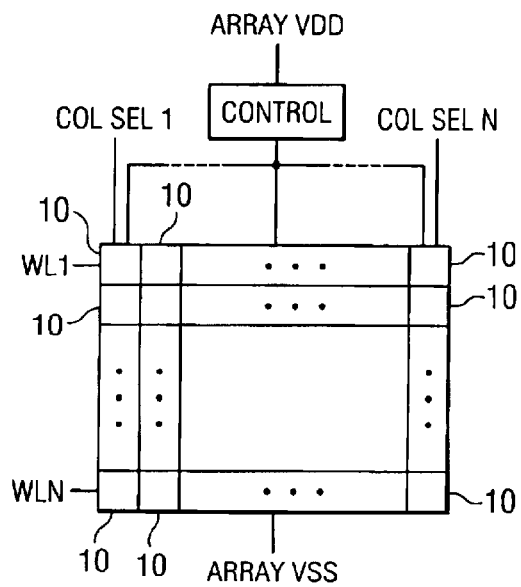
FIG. 1B is a block diagram of a memory cell array having multiple row select and column select control lines.

Referring again to FIG. 1A and FIG. 1B, there is shown one conventional cell 10 comprising one of an array of cells in array 12, whereby rows of cells 10 each have a common wordline WL and are arranged in columns. Columns of cells 10 in array 12 each have common bitlines B and B_. In addressing cells in the memory array, one row of cells 10 is selected whereby the associated wordline WL is high, and some subset of the columns are selected. For a READ, all bit-lines B and B_are pre-charged high, and all memory cells 10 on the selected row see the same environment.

For a WRITE, all bit-lines are initially pre-charged high, and then either bit-line B or B_of a selected column is driven low. Bits in the unselected columns see the same environment as for READ.

Accordingly, whatever is done to improve WRITE in the selected cells 10 must not cause instability of the cells 10 in un-addressed columns. Therefore, this restricts either boosting WL for WRITE versus READ, or, lowering the array Vdd for WRITE versus READ.

Figure 2:
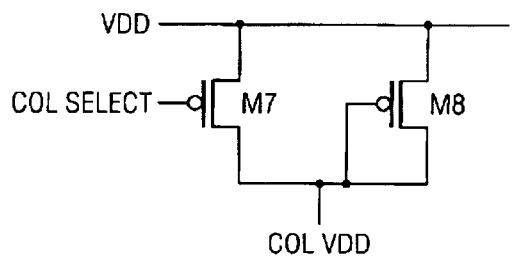
FIG. 2 is a schematic of a column Vdd being isolated from the array Vdd according to an embodiment of the present invention.
Figure 3:
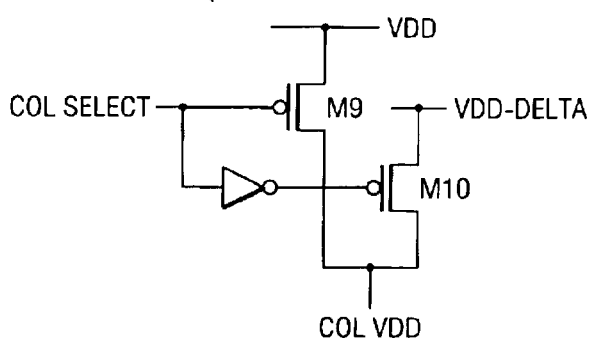
FIG. 3 is a schematic of the column Vdd being selectively lowered from the array Vdd by a difference of delta.

According to the present invention, as shown in FIGS. 2 and FIG. 3, the embodiments of the present invention isolate the Vdd of the memory cells in each column as depicted at 20 in FIG. 2 and is controlled by the associated column select line. During a WRITE, the associated Vdd of the selected columns of memory cells is lowered from array Vdd by a difference of delta, as shown in FIG. 3. Advantageously, the access transistor is turned on more strongly by the wordline WL at array Vdd (or other selected WL voltage) than is the load transistor at the reduced column voltage Vdd (array Vdd minus delta), and the memory cell 10 is advantageously more easily written to. Further, column Vdd of memory cells 10 in unaddressed columns in the addressed row remain at array Vdd and are more stable. Memory cells 10 in the un-addressed rows in the addressed columns will not have the respective access transistors turned on, and therefore are more stable.

Advantageously, with the WRITE cycle being facilitated with a lowered column Vdd, the cells 10 with the variable column voltage Vdd can be designed to be more stable than would otherwise have been possible while maintaining the ability to WRITE.

Figure 4:
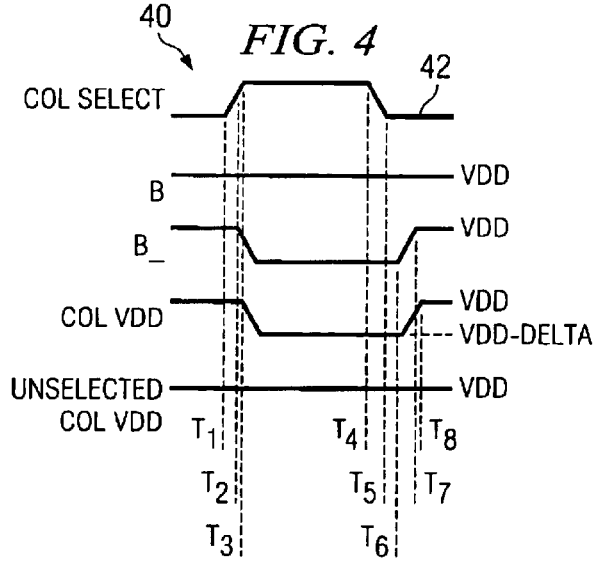
FIG. 4 is a timing diagram according to the present invention whereby the column Vdd is selectively lowered for an addressed column of memory cells during a WRITE cycle.

Referring now to FIG. 4, there is shown a timing diagram of a WRITE cycle, whereby at time $T_1$ the column of a memory cell 10 to be written to has it's associated column select line transitioning to a logic 1, as shown as signal 42. At this time, both the bit-line B and B_are pre-charged high as is conventional.

At time $T_2$, the bit-line B_is then transitioned low.

Thereafter, at time $T_3$, the associated column voltage Vdd is reduced a margin "delta", while the column voltage Vdd for unaddressed columns of memory cells remains at array Vdd, as shown. Therefore, all unselected memory cells 10 in the unaddressed columns remain stable and have the array Vdd voltage applied thereto. The addressed memory cell, however, has a reduced column voltage that advantageously improves the ability to WRITE to the selected memory cell 10. The stability of unaddressed cells in the addressed column is reduced by the reduced column voltage. These unaddressed cells in the addressed column have a large margin for stability since the word line voltage is low (unselected) for these unaddressed cells. Full stability of the cells in the column selected for WRITE is restored when the column Vdd of this cell is brought to array Vdd again after completion of the WRITE into the addressed cell. Moreover, the unaddressed memory cells 10 of the unaddressed columns always remain at voltage array Vdd.

To conclude the WRITE cycle, there is shown at time $T_4$ that the column select signal 42 is transitioned low, whereby at time $T_5$ the associated column select line has completed the transition to low. Thereafter, at time $T_6$, the bit-line B_is transitioned back to array Vdd, whereby at time $T_7$ the associated column Vdd is brought back up to array Vdd the completion of which is at time $T_8$.

Possible variations in the timing sequence will be apparent to those skilled in the art. For example, the lowering of the selected column voltage Vdd may occur before or simultaneously with the transition of a bitline voltage low for WRITE. Similarly, the addressed column voltage Vdd may be restored to array Vdd prior to or simultaneously with restoration of the bitline voltage to Vdd. Also, restoration of the selected column voltage Vdd to array Vdd may extend into the beginning of a following cycle.

The column Vdd capacitance is generally a little larger than bit-line capacitance, which may raise concern about the size of driver needed for switching the column Vdd voltage and for the power consumed in switching column Vdd voltage. These concerns are reduced by recognizing that the voltage on column Vdd does not have to swing as far as the voltage on bit-line.

Swinging column Vdd consumes power, but the net power is reduced when the bit-line voltage swing is reduced. Also, WRITE speed is also improved. Optionally, the enhancement of WRITE obtained by lowering the column Vdd of addressed columns for WRITE can be used to allow use of smaller drive on bit lines or a limited voltage swing on bit lines for WRITE to reduce power.

Optionally, the column Vdd control can be enabled or disabled based on the relative strengths of the n-channel and p-channel transistors of cell 10. For example, if in-line probe reveals that the n-channel transistor are relatively weak and the p-channel transistors are relatively strong, the lowering of selected column Vdd for WRITE would be enabled, otherwise, not enabled. Alternatively, a choice to enable or disable the lowering of addressed column Vdd for WRITE may be based on testing of memory performance, enabling if the are failures to WRITE, not enabling otherwise; or enabling if a faster WRITE is desired, not enabling otherwise. The choice of enabling or not enabling can be implemented through choice of interconnected pattern if the decision is made prior to completion of interconnect. Other means for implementing a choice include use of a fuse or input of a control signal.

Optionally, the column Vdd control can be enabled or disabled based on operating mode, such as for selected test modes. The column Vdd control can be disabled for a screening test of WRITE margin. Alternatively, the column Vd control can be enabled for a screening test of noise margin at low voltage.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications. For example, the role of n-channel and p-channel transistors could be reversed and the sense of voltage high and voltage low reversed. Alternatively, column Vss could be raised for WRITE.

I claim:

1. A memory device, comprising:
    an array of memory cells arranged in columns and rows and having a column voltage Vdd; and
    memory cell address circuitry adapted to select the cells for WRITE by selection of a row and selection of at least one of the columns;
    wherein for the WRITE, the stability of the cells in the at least one of the selected columns is reduced relative to the cell stability in the unselected columns;
    further wherein the column voltage Vdd of the array of memory cells is an array voltage Vdd during READ.

2. The memory device as specified in claim 1, wherein the stability of the selected column is reduced by lowering the column voltage Vdd applied to at least one selected columns.

3. The memory device as specified in claim 2, wherein the reduction in column voltage Vdd is selectively enabled.

4. The memory device as specified in claim 3, wherein the selective enablement is based on transistor parameters of the selected columns.

5. The memory device as specified in claim 4 wherein the address circuitry comprises a first access transistor selectively coupling the array voltage Vdd to a respective column, and a second pass transistor selectively coupling a voltage being lower than the array voltage Vdd to the respective column.

6. The memory device as specified in claim 4 wherein the column voltage Vdd is enabled and disabled as a function of a noise margin of an n-channel and p-channel of the transistors forming the memory cells.

7. The memory device as specified in claim 1, wherein a bitline is associated with each said column, and wherein a voltage swing on the bit line required for the WRITE is reduced relative to that which would be required if the stability of the cells in the selected column were not reduced.

8. The memory device as specified in claim 1 wherein column voltage Vdd of the at least one of the selected columns is lowered from the array voltage Vdd during WRITE.

9. The memory device as specified in claim 1 wherein the column voltage Vdd in each of the columns is isolated from the array voltage Vdd.

10. The memory device as specified in claim 1 wherein each of the columns of the memory cells has an associated column voltage Vdd, whereby the column voltage Vdd is lowered during a WRITE to the associated cells in that column.

11. The memory device as specified in claim 10 wherein the address circuitry lowers the column voltage Vdd of the selected column of memory cells after the associated column of memory cells has been selected.

12. The memory device as specified in claim 1 wherein the column voltage Vdd of unselected memory cells in the array remains at the array voltage Vdd.

13. The memory device as specified in claim 1 wherein the address circuit raises the column voltage Vdd of an associated column of memory cells upon conclusion of the WRITE.

14. The memory device as specified in claim 1 wherein the memory cells comprise SRAM cells.

15. The memory device as specified in claim 1 wherein each of the memory cells has an associated bit line, wherein the bit line has a reduced bit line swing during the WRITE of the selected memory cell.

* * * * *